US011720127B2

(12) United States Patent
Choi

(10) Patent No.: US 11,720,127 B2
(45) Date of Patent: Aug. 8, 2023

(54) AMPLIFIER AND VOLTAGE GENERATION CIRCUIT INCLUDING THE SAME

(71) Applicant: SK hynix Inc., Icheon-si (KR)

(72) Inventor: Suk Hwan Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 40 days.

(21) Appl. No.: 17/077,631

(22) Filed: Oct. 22, 2020

(65) Prior Publication Data

US 2022/0019252 A1 Jan. 20, 2022

(30) Foreign Application Priority Data

Jul. 17, 2020 (KR) ........................ 10-2020-0088634

(51) Int. Cl.
*G05F 1/575* (2006.01)
*G05F 1/46* (2006.01)
*G05F 1/445* (2006.01)

(52) U.S. Cl.
CPC .............. *G05F 1/461* (2013.01); *G05F 1/445* (2013.01); *G05F 1/575* (2013.01)

(58) Field of Classification Search
CPC .......... G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735
USPC .......................................... 323/271–289, 315
See application file for complete search history.

(56) References Cited

U.S. PATENT DOCUMENTS

| | | | |
|---|---|---|---|
| 6,177,785 B1 * | 1/2001 | Lee ......................... | G05F 3/247 323/349 |
| 7,071,667 B2 * | 7/2006 | Itohara .................. | H02M 3/156 323/284 |
| 7,183,755 B2 * | 2/2007 | Itoh ....................... | G05F 1/5735 323/277 |
| 7,868,601 B1 * | 1/2011 | Li ............................ | G05F 1/56 323/283 |
| 7,908,500 B2 | 3/2011 | Westwick et al. | |
| 8,072,266 B1 * | 12/2011 | Hoomes .................... | H03F 3/21 330/297 |
| 8,400,862 B2 | 3/2013 | Tejada | |
| 8,587,380 B2 * | 11/2013 | Wang ..................... | H03F 1/0261 330/296 |
| 8,716,993 B2 * | 5/2014 | Kadanka ................. | G05F 1/565 323/280 |
| 9,000,742 B2 * | 4/2015 | Chen ....................... | G05F 1/575 323/275 |
| 9,146,569 B2 * | 9/2015 | Li ........................... | G05F 1/565 |
| 10,108,209 B2 * | 10/2018 | Ideno ...................... | H02H 9/04 |

(Continued)

FOREIGN PATENT DOCUMENTS

EP 3454164 A1 * 3/2019 .............. G05F 1/56
WO WO-2020170394 A1 * 8/2020 ............. G05F 1/461

*Primary Examiner* — Thienvu V Tran
*Assistant Examiner* — Nusrat Quddus
(74) *Attorney, Agent, or Firm* — William Park & Associates Ltd.

(57) ABSTRACT

A voltage generation circuit includes an amplifier configured to detect a difference between a reference voltage and a feedback voltage according to a control signal and a bias current, and configured to generate a driving signal. The voltage generation circuit also includes a driver configured to generate an internal voltage by driving an external voltage according to the driving signal. The amount of the bias current may be forcibly adjusted by the control signal.

26 Claims, 6 Drawing Sheets

(56) References Cited

U.S. PATENT DOCUMENTS

| | | | |
|---|---|---|---|
| 10,775,823 B2* | 9/2020 | Kotrc | G05F 1/565 |
| 10,895,884 B2* | 1/2021 | Kotrc | G05F 1/468 |
| 11,086,343 B2* | 8/2021 | Kim | G05F 1/56 |
| 2001/0000655 A1* | 5/2001 | Morishita | G05F 1/465 |
| | | | 327/541 |
| 2008/0061881 A1* | 3/2008 | Takagi | H03F 1/0277 |
| | | | 330/261 |
| 2008/0174289 A1* | 7/2008 | Gurcan | G05F 1/575 |
| | | | 323/280 |
| 2009/0021229 A1* | 1/2009 | Heilmann | G05F 1/565 |
| | | | 323/280 |
| 2009/0195290 A1* | 8/2009 | Moraveji | G05F 1/575 |
| | | | 327/331 |
| 2010/0117608 A1* | 5/2010 | Tseng | G05F 1/573 |
| | | | 323/272 |
| 2010/0156364 A1* | 6/2010 | Cho | G05F 1/573 |
| | | | 323/280 |
| 2011/0254828 A1* | 10/2011 | Wadhwa | G05F 1/565 |
| | | | 345/212 |
| 2013/0154592 A1* | 6/2013 | Teh | G05F 1/56 |
| | | | 323/273 |
| 2014/0125300 A1* | 5/2014 | Price | G05F 1/468 |
| | | | 323/281 |
| 2014/0266105 A1* | 9/2014 | Li | G05F 1/565 |
| | | | 323/280 |
| 2014/0285243 A1* | 9/2014 | Nakamoto | H03K 17/223 |
| | | | 327/143 |
| 2015/0185745 A1* | 7/2015 | Kim | G05F 1/613 |
| | | | 327/541 |
| 2015/0188526 A1* | 7/2015 | Choi | H03K 5/13 |
| | | | 327/263 |
| 2016/0239029 A1* | 8/2016 | Ideno | H02H 9/04 |

* cited by examiner

AMPLIFIER AND VOLTAGE GENERATION CIRCUIT INCLUDING THE SAME

CROSS-REFERENCES TO RELATED APPLICATION

The present application claims priority under 35 U.S.C. § 119(a) to Korean application number 10-2020-0088634, filed on Jul. 17, 2020, in the Korean Intellectual Property Office, which is incorporated herein by reference in its entirety.

BACKGROUND

1. Technical Field

Various embodiments generally relate to a semiconductor circuit, and more particularly, relate to an amplifier and a voltage generation circuit including the amplifier.

2. Related Art

Semiconductor circuits use voltage generation circuits to generate, from external voltages, various internal voltages essential for the operations of internal circuits of the semiconductor circuits.

In order to for a semiconductor memory circuit, for example, to switch to an active mode to perform a data input/output operation, and the like, a voltage generation circuit is designed to have a fast response speed by increasing its driving capability. When the voltage generation circuit is designed to have a fast response speed, it may cause a peak current problem at the beginning of an operation such as a power-up state.

SUMMARY

Various embodiments are directed to providing a stably operating amplifier capable of reducing a peak current and a voltage generation circuit including the amplifier.

In an embodiment, an amplifier may include a first stage configured to detect and output a difference between a reference voltage and a feedback voltage according to a control signal and a bias current, wherein an amount of the bias current may be forcibly adjusted by the control signal.

In an embodiment, a voltage generation circuit may include: an amplifier configured to detect a difference between a reference voltage and a feedback voltage according to a control signal and a bias current, and configured to generate a driving signal; and a driver configured to generate an internal voltage by driving an external voltage according to the driving signal, wherein an amount of the bias current may be forcibly adjusted by the control signal.

In an embodiment, a voltage generation circuit may include: a first transistor array to which an external voltage is applied in common and having a gate terminal to which a bias voltage is applied in common; a second transistor array electrically connected to the first transistor array and having a gate terminal to which a control signal is inputted in common; a third transistor electrically connected to the first transistor array and the second transistor array and configured to receive a reference voltage; a fourth transistor electrically connected between the third transistor and a ground voltage terminal; a fifth transistor electrically connected to the first transistor array and the second transistor array and configured to receive a feedback voltage; a sixth transistor electrically connected between the fifth transistor and the ground voltage terminal and configured to generate a driving signal; a driver configured to generate an internal voltage by driving the external voltage according to the driving signal; and a distribution resistor configured to generate the feedback voltage by distributing the internal voltage, wherein an amount of a bias current flowing through the first transistor array and the second transistor array according to the bias voltage may be forcibly adjusted according to the control signal.

DETAILED DESCRIPTION

Hereinafter, embodiments of the present disclosure are described in more detail with reference to the drawings.

Figure 1:
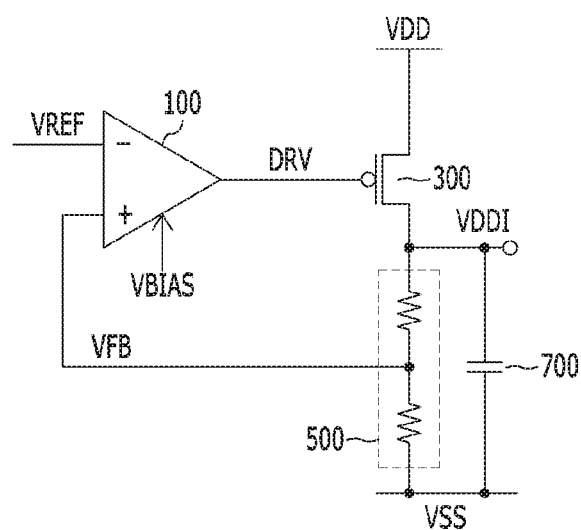
FIG. 1 is a diagram illustrating a configuration of a voltage generation circuit in accordance with an embodiment.

FIG. 1 is a diagram illustrating a configuration of a voltage generation circuit 10 in accordance with an embodiment.

Referring to FIG. 1, the voltage generation circuit 10 may generate an internal voltage VDDI according to a bias voltage VBIAS, a reference voltage VREF, and a feedback voltage VFB.

The voltage generation circuit 10 may include an amplifier 100, a driver 300, a distribution resistor 500, and a capacitor 700.

The amplifier 100 may generate a driving signal DRV according to the bias voltage VBIAS, the reference voltage VREF, and the feedback voltage VFB.

The driver 300 may generate the internal voltage VDDI by driving an external voltage VDD according to the driving signal DRV.

The driver 300 may have a source terminal to which the external voltage VDD is applied, a gate terminal to which the driving signal DRV is inputted, and a drain terminal to which a terminal of the internal voltage VDDI is electrically connected.

The distribution resistor 500 may generate the feedback voltage VFB by distributing the internal voltage VDDI.

The capacitor 700 may be electrically connected between the terminal of the internal voltage VDDI and a terminal of a ground voltage VSS in parallel with the distribution resistor 500.

The capacitor 700 may serve as an output terminal load of the voltage generation circuit 10.

The capacitor 700 may be designed to have a relatively larger capacitance than the capacitance of transistors of the voltage generation circuit 10.

Figure 2:
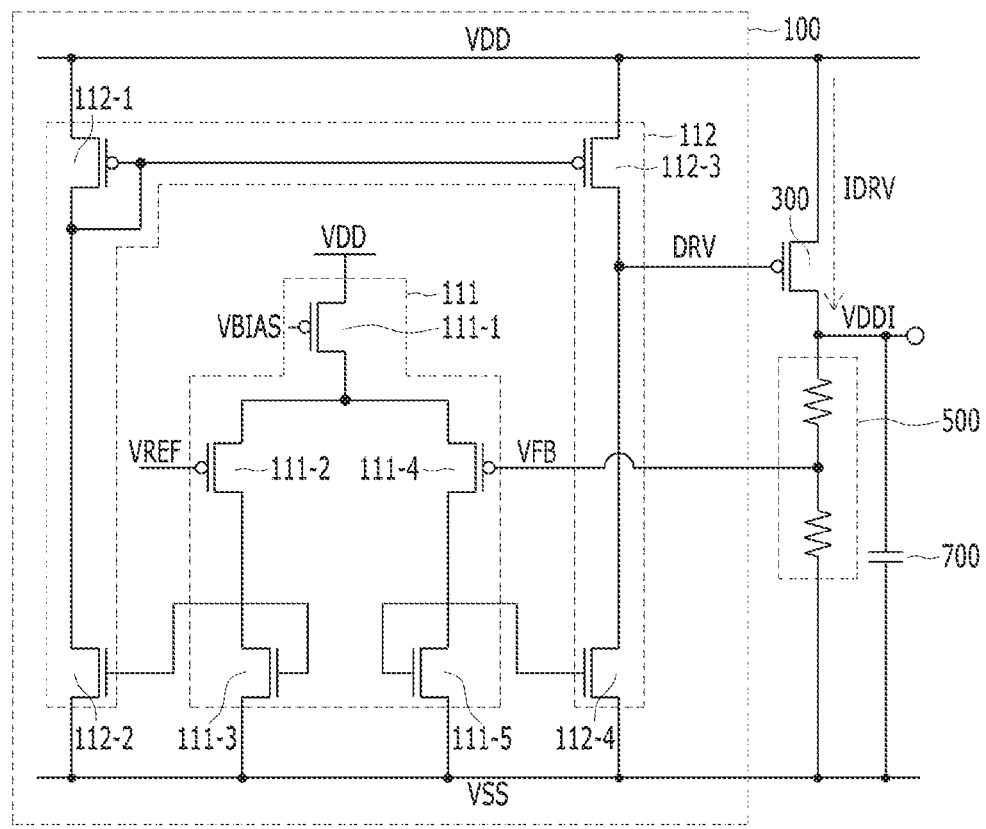
FIG. 2 is a diagram illustrating a configuration of an embodiment of an amplifier of FIG. 1.

FIG. 2 is a diagram illustrating a configuration of an embodiment of the amplifier 100 of FIG. 1.

Referring to FIG. 2, the amplifier 100 may include a comparator 111 and a current mirror 112.

The comparator 111 may compare the reference voltage VREF and the feedback voltage VFB and output a result of the comparison.

The current mirror 112 may generate the driving signal DRV according to the output of the comparator 111.

The comparator 111 may include first to fifth transistors 111-1 to 111-5.

The first transistor 111-1 may have a source terminal to which the external voltage VDD is applied, and a gate terminal to which the bias voltage VBIAS is applied.

The second transistor 111-2 may have a source terminal electrically connected to a drain terminal of the first transistor 111-1, and a gate terminal to which the reference voltage VREF is applied.

The third transistor 111-3 may have a source terminal to which the ground voltage VSS is applied, and a drain terminal electrically connected to its own gate terminal and a drain terminal of the second transistor 111-2.

The fourth transistor 111-4 may have a source terminal electrically connected to the drain terminal of the first transistor 111-1, and a gate terminal to which the feedback voltage VFB is to applied.

The fifth transistor 111-5 may have a source terminal to which the ground voltage VSS is applied, and a drain terminal electrically connected to its own gate terminal and a drain terminal of the fourth transistor 111-4.

The current mirror 112 may include first to fourth transistors 112-1 to 112-4.

The first transistor 112-1 may have a source terminal to which the external voltage VDD is applied, and a gate terminal electrically connected to its own drain terminal.

The second transistor 112-2 may have a source terminal to which the ground voltage VSS is applied, and a drain terminal electrically connected to the drain terminal of the first transistor 112-1.

A gate terminal of the second transistor 112-2 may be electrically connected to the drain terminal of the third transistor 111-3 of the comparator 111.

The third transistor 112-3 may have a source terminal to which the external voltage VDD is applied, and a gate terminal electrically connected to the gate terminal of the first transistor 112-1.

The fourth transistor 112-4 may have a source terminal to which the ground voltage VSS is applied, and a drain terminal electrically connected to a drain terminal of the third transistor 112-3.

A gate terminal of the fourth transistor 112-4 may be electrically connected to the drain terminal of the fifth transistor 111-5 of the comparator 111.

Figure 3:
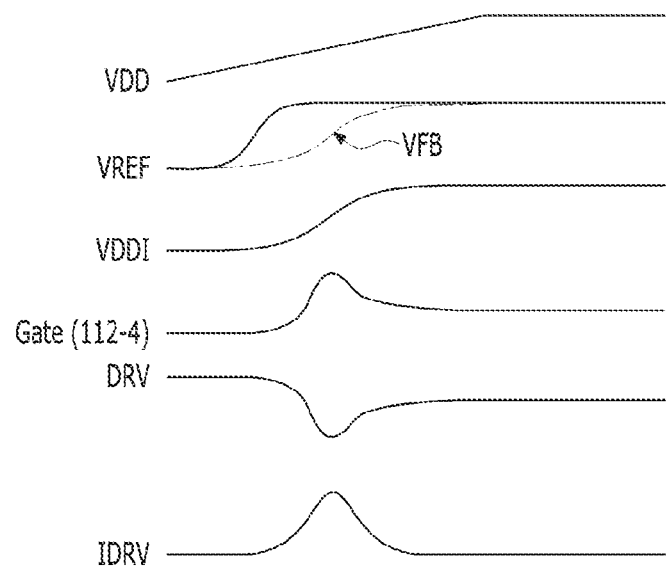
FIG. 3 is a diagram illustrating signal waveforms in accordance with FIG. 2.

FIG. 3 is a diagram illustrating signal waveforms in accordance with FIG. 2.

With reference to FIG. 3, the operation of the voltage generation circuit 10 is described as follows.

As the level of the external voltage VDD increases during the power-up process of a semiconductor apparatus, the level of the reference voltage VREF also increases.

As the level of the reference voltage VREF increases, the level of the gate terminal of the fourth transistor 112-4 of the current mirror 112 increases, so that the level of the driving signal DRV decreases, and thus the level of the internal voltage VDDI may increase.

Then, the level of the driving signal DRV increases or decreases by comparing the levels of the reference voltage VREF and the feedback voltage VFB, and thus the level of the internal voltage VDDI may be substantially maintained at a target level.

On the other hand, the level of the internal voltage VDDI needs to increase in proportion to an increase in the level of the reference voltage VREF, but the level of the internal voltage VDDI may not increase due to the capacitor 700 designed to have a large capacitance, and thus the level of the feedback voltage VFB may not also increase.

As the level of the feedback voltage VFB does not increase with an increase in the level of the reference voltage VREF, that is, as the level of the feedback voltage VFB is relatively lower than that of the reference voltage VREF, a relatively large amount of current due to the bias voltage VBIAS may flow through the fourth transistor 111-4 as compared to the second transistor 111-2.

As the relatively large amount of current flows through the fourth transistor 111-4, the level of the gate terminal of the fourth transistor 112-4 may increase rapidly.

As the level of the gate terminal of the fourth transistor 112-4 increases rapidly, the level of the driving signal DRV decreases rapidly, and thus an output voltage driving current, that is, a current IDRV flowing to the capacitor 700 through the driver 300, may increase rapidly, resulting in an increase in the peak current.

Figure 4:
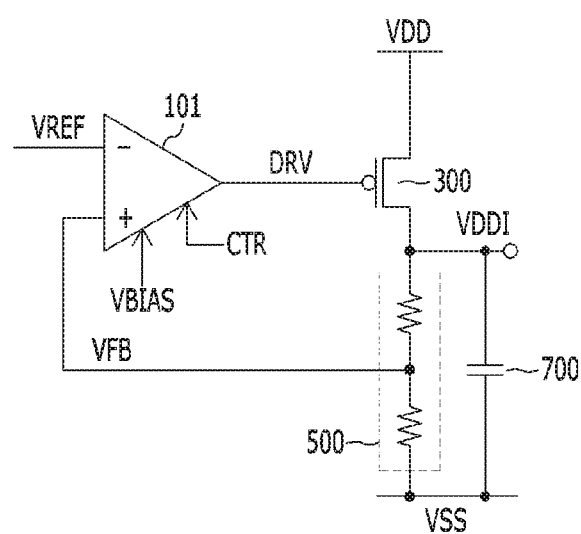
FIG. 4 is a diagram illustrating a configuration of a voltage generation circuit in accordance with another embodiment.

FIG. 4 is a diagram illustrating a configuration of a voltage generation circuit 11 in accordance with another embodiment.

Referring to FIG. 4, the voltage generation circuit 11 may generate the internal voltage VDDI according to the bias voltage VBIAS, a control signal CTR, the reference voltage VREF, and the feedback voltage VFB.

The voltage generation circuit 11 may differently adjust a slew rate of the driving signal DRV before and after the level of the external voltage VDD reaches a set level, according to the control signal CTR, and generate the internal voltage VDDI according to the driving signal DRV with the adjusted slew rate.

In a semiconductor apparatus, a power-on reset (POR) signal for initializing various circuits after power-up may be used as the control signal CTR.

During the power-up process, the level of the power-on reset signal may increase with an increase in the external voltage VDD to substantially maintain a high level, and may transition to a low level when the level of the external voltage VDD is equal to or more than a set level.

The voltage generation circuit 11 may include an amplifier 101, the driver 300, the distribution resistor 500, and the capacitor 700.

The amplifier 101 may generate the driving signal DRV according to the bias voltage VBIAS, the control signal CTR, the reference voltage VREF, and the feedback voltage VFB.

The amplifier 101 may generate the driving signal DRV by detecting a difference between the reference voltage VREF and the feedback voltage VFB according to a bias current.

The amount of the bias current may be constantly maintained according to the bias voltage VBIAS when a level of the bias voltage VBIAS is constant.

Embodiments of the present disclosure can forcibly adjust the amount of the bias current using the control signal CTR, within a maximum value determined according to the bias voltage VBIAS, although the level of the bias voltage VBIAS is constant.

The driver 300 may generate the internal voltage VDDI by driving the external voltage VDD according to the driving signal DRV.

The driver 300 may have a source terminal to which the external voltage VDD is applied, a gate terminal to which the driving signal DRV is inputted, and a drain terminal to which the terminal of the internal voltage VDDI is electrically connected.

The driver 300 may be configured as a PMOS transistor.

The distribution resistor 500 may generate the feedback voltage VFB by distributing the internal voltage VDDI.

The capacitor 700 may be electrically connected between the terminal of the internal voltage VD and the terminal of the ground voltage VSS in parallel with the distribution resistor 500.

The capacitor 700 may serve as an output terminal load of the voltage generation circuit 11.

The capacitor 700 may be designed to have a relatively larger capacitance than the capacitance of transistors of the voltage generation circuit 11.

Figure 5:
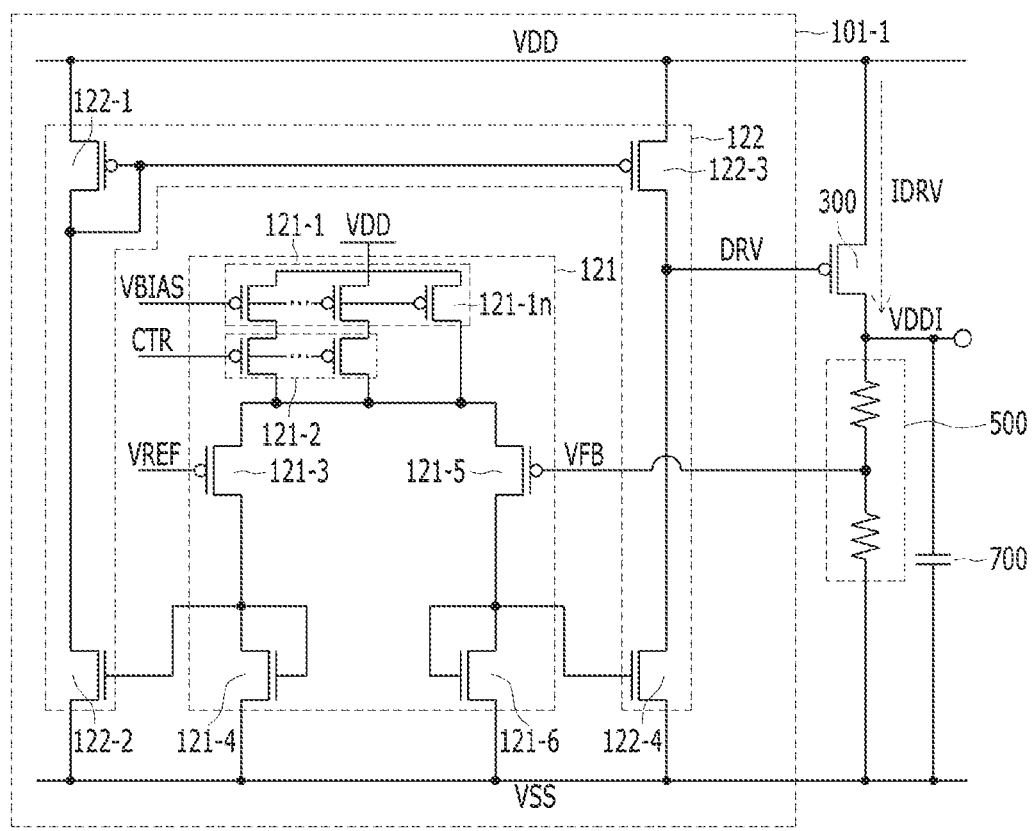
FIG. 5 is a diagram illustrating a configuration of an embodiment of an amplifier of FIG. 4.

FIG. 5 is a diagram illustrating a configuration of an embodiment 101-1 of the amplifier of FIG. 4.

Referring to FIG. 5, the amplifier 101-1 may include a plurality of stages, for example, a comparator 121 as a first stage and a current mirror 122 as a second stage.

The comparator 121 may detect and output a difference between the reference voltage VREF and the feedback voltage VFB according to the bias voltage VBIAS and the control signal CTR.

The comparator 121 may detect and output the difference between the reference voltage VREF and the feedback voltage VFB according to a bias current.

The amount of the bias current may be determined according to the bias voltage VBIAS.

The amount of the bias current may be forcibly adjusted by the control signal CTR within a maximum value determined according to the bias voltage VBIAS.

The current mirror 122 may generate the driving signal DRV according to the output of the comparator 121.

The comparator 121 may include a first transistor array 121-1, a second transistor array 121-2, and third to sixth transistors 121-3 to 121-6.

The first transistor array 121-1 may include a plurality of transistors having source terminals to which the external voltage VDD is applied in common and gate terminals to which the bias voltage VBIAS is applied in common.

The second transistor array 121-2 may include a plurality of transistors having source terminals which are respectively and electrically connected to drain terminals of the transistors of the first transistor array 121-1, except for one transistor 121-1n among the transistors of the first transistor array 121-1, and gate terminals to which the control signal CTR is inputted in common.

The plurality of transistors of the first transistor array 121-1 and the second transistor array 121-2 may be configured as PMOS transistors.

The third transistor 121-3 may be configured as a first input terminal for receiving the reference voltage VREF.

The third transistor 121-3 may have a source terminal electrically connected to the first transistor array 121-1 and the second transistor array 121-2, and a gate terminal to which the reference voltage VREF is applied.

The source terminal of the third transistor 121-3 may be electrically connected in common to a drain terminal of the one transistor 121-1n among the plurality of transistors of the first transistor array 121-1 and drain terminals of the transistors of the second transistor array 121-2, and the gate terminal thereof may receive the reference voltage VREF.

The fourth transistor 121-4 may have a source terminal to which the ground voltage VSS is applied and a drain terminal electrically connected to its own gate terminal and a drain terminal of the third transistor 121-3.

The fifth transistor 121-5 may be configured as a second input terminal for receiving the feedback voltage VFB.

The fifth transistor 121-5 may have a source terminal electrically connected to the first transistor array 121-1 and the second transistor array 121-2, and a gate terminal to which the feedback voltage VFB is applied.

The source terminal of the fifth transistor 121-5 may be electrically connected in common to the drain terminal of the one transistor 121-1n among the plurality of transistors of the first transistor array 121-1 and drain terminals of the transistors of the second transistor array 121-2, and the gate terminal thereof may receive the feedback voltage VFB.

The sixth transistor 121-6 may have a source terminal to which the ground voltage VSS is applied and a drain terminal electrically connected to its own gate terminal and a drain terminal of the fifth transistor 121-5.

The third and fifth transistors 121-3 and 121-5 may be configured as PMOS transistors.

The fourth and sixth transistors 121-4 and 121-6 may be configured as N MOS transistors.

The plurality of transistors of the first transistor array 121-1 and the plurality of transistors of the second transistor array 121-2 may have narrower gate widths than the third to sixth transistors 121-3 to 121-6.

For example, when the gate width of each of the third to sixth transistors 121-3 to 121-6 is 'N', the gate width of each of the plurality of transistors of the first transistor array 121-1 may be '1/N'.

The gate width of each of the plurality of transistors of the second transistor array 121-2 may also be '1/N'.

The sum of current driving forces of both the first transistor array 121-1 and the second transistor array 121-2 and the current driving force of each of the third to sixth transistors 121-3 to 121-6 may be substantially the same.

The current mirror 122 may include first to fourth transistors 122-1 to 122-4.

The first transistor 122-1 may have a source terminal to which the external voltage VDD is applied, and a gate terminal electrically connected to its own drain terminal.

The second transistor 122-2 may have a source terminal to which the ground voltage VSS is applied, and a drain terminal electrically connected to a drain terminal of the first transistor 122-1.

A gate terminal of the second transistor 122-2 may be electrically connected to the drain terminal of the fourth transistor 121-4 of the comparator 121.

The third transistor 122-3 may have a source terminal to which the external voltage VDD is applied, and a gate terminal electrically connected to the gate terminal of the first transistor 122-1.

The fourth transistor 122-4 may have a source terminal to which the ground voltage VSS is applied, and a drain terminal electrically connected to a drain terminal of the third transistor 122-3.

A gate terminal of the fourth transistor 122-4 may be electrically connected to the drain terminal of the sixth transistor 121-6 of the comparator 121.

The first and third transistors 122-1 and 122-3 may be configured as PMOS transistors.

The second and fourth transistors 122-2 and 122-4 may be configured as NMOS transistors.

Figure 6:
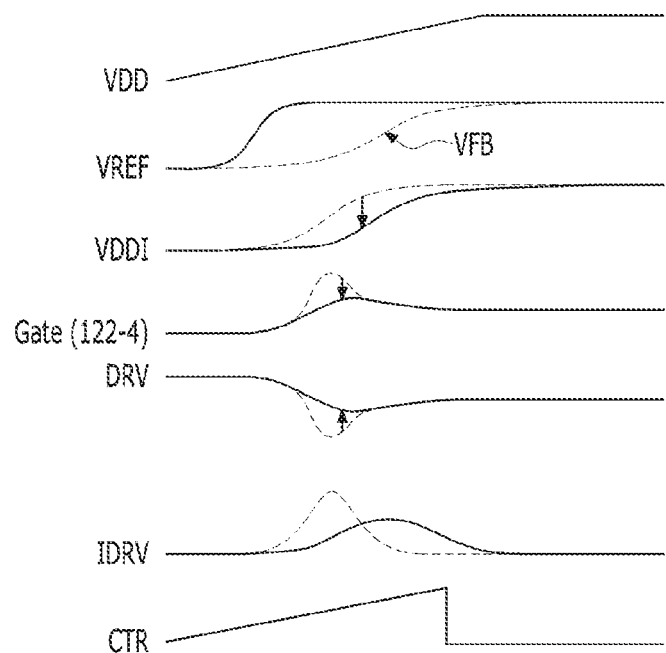
FIG. 6 is a diagram illustrating signal waveforms in accordance with FIG. 5.

FIG. 6 is a diagram illustrating signal waveforms in accordance with FIG. 5.

With reference to FIG. 6, the operation of the voltage generation circuit 11 is described as follows.

As the level of the external voltage VDD increases during the power-up process of the semiconductor apparatus, the level of the reference voltage VREF also increases.

As the level of the external voltage VDD increases, the voltage level of the control signal CTR also increases, and as the voltage level of the control signal CTR reaches a high level based on a logic level, the second transistor array 121-2 may be turned off.

As the second transistor array 121-2 is turned off, a current corresponding to the bias voltage VBIAS may flow only through the one transistor 121-1*n* among the plurality of transistors of the first transistor array 121-1.

The level of the internal voltage VDDI needs to increase in proportion to an increase in the level of the reference voltage VREF, but the level of the internal voltage VDDI may not increase due to the capacitor 700 designed to have a large capacitance, and thus the level of the feedback voltage VFB may not also increase.

As the level of the feedback voltage VFB does not increase with an increase in the level of the reference voltage VREF, that is, as the level of the feedback voltage VFB is relatively lower than that of the reference voltage VREF, a relatively large amount of current corresponding to the bias voltage VBIAS may flow through the fifth transistor 121-5 compared to the third transistor 121-3.

As the relative current amount increases, but the amount of the bias current decreases, the level of the gate terminal of the fourth transistor 122-4 of the current mirror 122 may increase gently.

The relative current amount may refer to the amount of a current flowing through the fifth transistor 121-5 as compared to the third transistor 121-3, and the amount of the bias current may refer to the amount of a current supplied to the third transistor 121-3 and the fifth transistor 121-5 through the first transistor array 121-1 and the second transistor array 121-2 according to the bias voltage VBIAS.

When the control signal CTR is at a high level, the amount of the bias current when a current flows only through the one transistor 121-1*n* among the plurality of transistors of the first transistor array 121-1 is 1/N. Thus, it may be reduced compared to the amount N of the bias current when a current flows through all of the plurality of transistors of the first transistor array 121-1.

As the level of the gate terminal of the fourth transistor 122-4 increases gently, the level of the driving signal DRV decreases gently, and thus the output voltage driving current, that is, the current IDRV flowing to the capacitor 700 through the driver 300 may increase gently, resulting in an increase in the peak current during the power-up process.

When the level of the external voltage VDD increases and is equal to or more than a set level, the control signal CTR may transition to a low level.

As the control signal CTR transitions to a low level, the second transistor array 121-2 may be turned on.

As the second transistor array 121-2 is turned on, a current corresponding to the bias voltage VBIAS may flow through all of the plurality of transistors of the first transistor array 121-1.

After the level of the external voltage VDD is stabilized to the set level, the amount of the bias current may be restored to N.

Then, the level of the driving signal DRV increases or decreases by comparing the levels of the reference voltage VREF and the feedback voltage VFB, and thus the level of the internal voltage VDDI may be substantially maintained at a target level.

According to the embodiment, it is possible to decrease the peak current by decreasing the amount of the bias current using the control signal before the power-up period, that is, before the level of the external voltage VDD is stabilized to the set level, and it is possible to substantially maintain the internal voltage VDDI at a normal level by increasing the amount of the bias current after the level of the external voltage VDD is stabilized to the set level.

Figure 7:
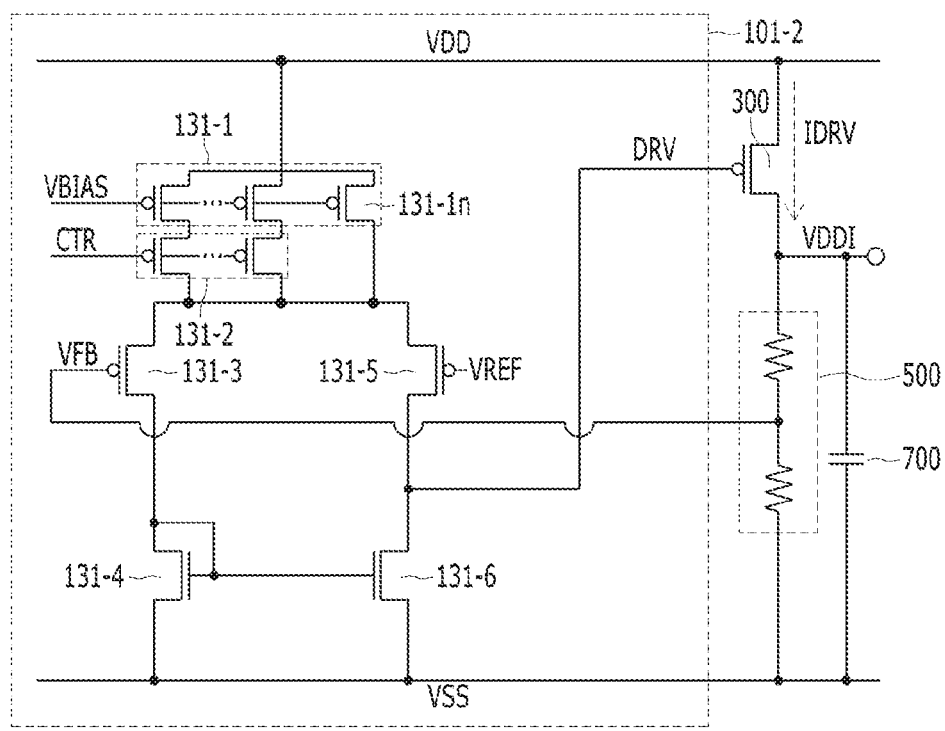
FIG. 7 is a diagram illustrating a configuration of another embodiment of the amplifier of FIG. 4.

FIG. 7 is a diagram illustrating a configuration of another embodiment 101-2 of the amplifier of FIG. 4.

Referring to FIG. 7, the amplifier 101-2 may compare the reference voltage VREF and the feedback voltage VFB according to the bias voltage VBIAS and the control signal CTR, and generate the driving signal DRV according to a result of the comparison.

The amplifier 101-2 may detect and output a variation in the amount of a relative current generated according to a difference between the reference voltage VREF and the feedback voltage VFB based on a bias current.

The amount of the bias current may be determined to according to the bias voltage VBIAS.

The amount of the bias current may be forcibly adjusted by the control signal CTR within a maximum value determined according to the bias voltage VBIAS.

The amplifier 101-2 may be configured as a single stage.

The single stage may include a first transistor array 131-1, a second transistor array 131-2, and third to sixth transistors 131-3 to 131-6.

The first transistor array 131-1 may include a plurality of transistors having source terminals to which the external voltage VDD is applied in common and gate terminals to which the bias voltage VBIAS is applied in common.

The second transistor array 131-2 may include a plurality of transistors having source terminals which are respectively and electrically connected to drain terminals of the transistors of the first transistor array 131-1, except for one transistor 131-1*n* among the transistors of the first transistor array 131-1, and gate terminals to which the control signal CTR is inputted in common.

The plurality of transistors of the first transistor array 131-1 and the second transistor array 131-2 may be configured as PMOS transistors.

The third transistor 131-3 may have a source terminal electrically connected to the first transistor array 131-1 and the second transistor array 131-2, and a gate terminal to which the feedback voltage VFB is applied.

The source terminal of the third transistor 131-3 may be electrically connected in common to a drain terminal of the one transistor 131-1*n* among the plurality of transistors of the first transistor array 131-1 and drain terminals of the transistors of the second transistor array 131-2, and the gate terminal thereof may receive the feedback voltage VFB.

The fourth transistor 131-4 may have a source terminal to which the ground voltage VSS is applied, a drain terminal electrically connected to a drain terminal of the third transistor 131-3, and a gate terminal electrically connected to its own drain terminal.

The fifth transistor 131-5 may have a source terminal electrically connected to the first transistor array 131-1 and the second transistor array 131-2, and a gate terminal to which the reference voltage VREF is applied.

The source terminal of the fifth transistor 131-5 may be electrically connected in common to the drain terminal of the one transistor 131-1*n* among the plurality of transistors of the first transistor array 131-1 and drain terminals of the transistors of the second transistor array 131-2, and the gate terminal thereof may receive the reference voltage VREF.

The sixth transistor 131-6 may have a source terminal to which the ground voltage VSS is applied, a drain terminal electrically connected to the drain terminal of the fifth transistor 131-5, and a gate terminal electrically connected to the gate terminal of the fourth transistor 131-4.

The driving signal DRV may be generated through the drain terminal of the sixth transistor 131-6.

The third and fifth transistors 131-3 and 131-5 may be configured as PMOS transistors.

The fourth and sixth transistors 131-4 and 131-6 may be configured as NMOS transistors.

The plurality of transistors of the first transistor array 131-1 and the plurality of transistors of the second transistor array 131-2 may have narrower gate widths than the third to sixth transistors 131-3 to 131-6.

For example, when the gate width of each of the third to sixth transistors 131-3 to 131-6 is 'N', the gate width of each of the plurality of transistors of the first transistor array 131-1 may be '1/N'.

The gate width of each of the plurality of transistors of the second transistor array 131-2 may also be '1/N'.

The sum of current driving forces of both the first transistor array 131-1 and the second transistor array 131-2 and the current driving force of each of the third to sixth transistors 131-3 to 131-6 may be substantially the same.

When compared to the amplifier 101-1 of FIG. 5, the amplifier 101-2 of FIG. 7 has a single stage structure excluding a current mirror, which can result in a reduced circuit area.

In substantially the same manner as the amplifier 101-1 described with reference to FIG. 5 and FIG. 6, the amplifier 101-2 of FIG. 7 can decrease the peak current by decreasing the amount of the bias current using the control signal CTR before the power-up period, that is, before the level of the external voltage VDD is stabilized to the set level, and can substantially maintain the internal voltage VDDI at a normal level by increasing the amount of the bias current after the level of the external voltage VDD is stabilized to the set level.

Figure 8:
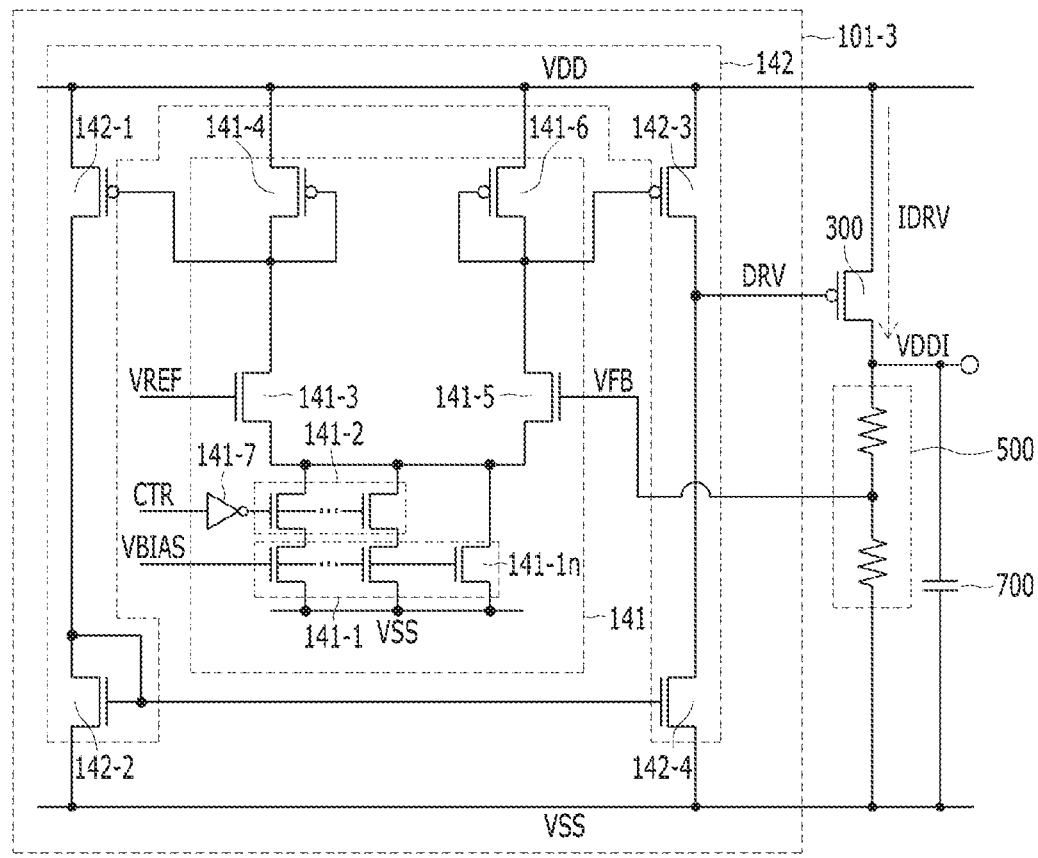
FIG. 8 is a diagram illustrating a configuration of further another embodiment of the amplifier of FIG. 4.

FIG. 8 is a diagram illustrating a configuration of yet another embodiment 101-3 of the amplifier of FIG. 4.

Referring to FIG. 8, the amplifier 101-3 may include a plurality of stages, for example, a comparator 141 as a first stage and a current mirror 142 as a second stage.

The comparator 141 may compare the reference voltage VREF and the feedback voltage VFB according to the bias voltage VBIAS and the control signal CTR, and output a result of the comparison.

The comparator 141 may detect and output the difference between the reference voltage VREF and the feedback voltage VFB according to a bias current.

The amount of the bias current may be determined according to the bias voltage VBIAS.

The amount of the bias current may be forcibly adjusted by the control signal CTR within a maximum value determined according to the bias voltage VBIAS.

The current mirror 142 may generate the driving signal DRV according to the output of the comparator 141.

The comparator 141 may include a first transistor array 141-1, a second transistor array 141-2, third to sixth transistors 141-3 to 141-6, and an inverter 141-7.

The inverter 141-7 may invert and output the control signal CTR.

The first transistor array 141-1 may include a plurality of transistors having source terminals to which the ground voltage VSS is applied in common and gate terminals to which the bias voltage VBIAS is applied in common.

The second transistor array 141-2 may include a plurality of transistors having source terminals which are respectively and electrically connected to drain terminals of the other transistors of the first transistor array 141-1, except for one transistor 141-1n among the transistors of the first transistor array 141-1, and gate terminals to which an output signal of the inverter 141-7 is inputted in common.

The plurality of transistors of the first transistor array 141-1 and the second transistor array 141-2 may be configured as NMOS transistors.

The third transistor 141-3 may have a source terminal electrically connected to the first transistor array 141-1 and the second transistor array 141-2, and a gate terminal to which the reference voltage VREF is applied.

The source terminal of the third transistor 141-3 may be electrically connected in common to a drain terminal of the one transistor 141-1n among the plurality of transistors of the first transistor array 141-1 and drain terminals of the transistors of the second transistor array 141-2, and the gate terminal thereof may receive the reference voltage VREF.

The fourth transistor 141-4 may have a source terminal to which the external voltage VDD is applied and a drain terminal electrically connected to its own gate terminal and a drain terminal of the third transistor 141-3.

The fifth transistor 141-5 may have a source terminal electrically connected to the first transistor array 141-1 and the second transistor array 141-2, and a gate terminal to which the feedback voltage VFB is applied.

The source terminal of the fifth transistor 141-5 may be electrically connected in common to the drain terminal of the one transistor 141-1n among the plurality of transistors of the first transistor array 141-1 and drain terminals of the transistors of the second transistor array 141-2, and the gate terminal thereof may receive the feedback voltage VFB.

The sixth transistor 141-6 may have a source terminal to which the external voltage VDD is applied and a drain terminal electrically connected to its own gate terminal and a drain terminal of the fifth transistor 141-5.

The third and fifth transistors 141-3 and 141-5 may be configured as N MOS transistors.

The fourth and sixth transistors 141-4 and 141-6 may be configured as PMOS transistors.

The plurality of transistors of the first transistor array 141-1 and the plurality of transistors of the second transistor array 141-2 may have narrower gate widths than the third to sixth transistors 141-3 to 141-6.

For example, when the gate width of each of the third to sixth transistors 141-3 to 141-6 is 'N', the gate width of each of the plurality of transistors of the first transistor array 141-1 may be '1/N'.

The gate width of each of the plurality of transistors of the second transistor array 141-2 may also be '1/N'.

The sum of current driving forces of both the first transistor array 141-1 and the second transistor array 141-2 and the current driving force of each of the third to sixth transistors 141-3 to 141-6 may be substantially the same.

The current mirror 142 may include first to fourth transistors 142-1 to 142-4.

The first transistor 142-1 may have a source terminal to which the external voltage VDD is applied, and a gate terminal electrically connected to the drain terminal of the fourth transistor 141-4 of the comparator 141.

The second transistor 142-2 may have a source terminal to which the ground voltage VSS is applied, a drain terminal electrically connected to a drain terminal of the first transistor 142-1, and a gate terminal electrically connected to its own drain terminal.

The third transistor 142-3 may have a source terminal to which the external voltage VDD is applied, and a gate terminal electrically connected to the drain terminal of the sixth transistor 141-6 of the comparator 141.

The fourth transistor 142-4 may have a source terminal to which the ground voltage VSS is applied, a drain terminal electrically connected to a drain terminal of the third transistor 142-3, and a gate terminal electrically connected to the gate terminal of the second transistor 142-2.

The first and third transistors 142-1 and 142-3 may be configured as PMOS transistors.

The second and fourth transistors 142-2 and 142-4 may be configured as NMOS transistors.

Compared to the amplifier 101-1 of FIG. 5, the amplifier 101-3 of FIG. 8 has substantially the same number of stages, but has a difference in that input terminals for receiving the reference voltage VREF and the feedback voltage VFB are configured as the NMOS transistors 141-3 and 141-5 instead of PMOS transistors.

In substantially the same manner as the amplifier 101-1 described with reference to FIG. 5 and FIG. 6, the amplifier 101-3 of FIG. 8 can decrease the peak current by decreasing the amount of the bias current using the control signal CTR before the power-up period, that is, before the level of the external voltage VDD is stabilized to the set level, and can substantially maintain the internal voltage VDDI at a normal level by increasing the amount of the bias current after the level of the external voltage VDD is stabilized to the set level.

The embodiments may have common characteristics that the peak current in the power-up period is reduced by adjusting the amount of the bias current according to the control signal CTR and the internal voltage VDDI is substantially maintained at a normal level after the power-up.

The embodiments may include an example in which an amplifier is configured as first and second stages and input terminals for receiving the reference voltage VREF and the feedback voltage VFB are configured as PMOS transistors as illustrated in FIG. 5, an example in which an amplifier is configured as a single stage as illustrated in FIG. 7, an example in which an amplifier is configured as first and second stages and input terminals for receiving the reference voltage VREF and the feedback voltage VFB are configured as NMOS transistors as illustrated in FIG. 8, and the like.

Accordingly, selective application is possible according to the characteristics of the embodiments and the characteristics of a semiconductor apparatus to which the embodiments are applied.

A person skilled in the art to which the present disclosure pertains will understand that the present disclosure may be carried out in other specific forms without changing the technical spirit or essential features of the present disclosure. Therefore, it should be understood that the embodiments described above are illustrative in all respects, not limitative. The scope of the present disclosure is defined by the claims provided below rather than the detailed description, and it should be construed that the meaning and scope of the claims and all modifications or modified forms derived from the equivalent concept thereof are included in the scope of the present disclosure.

What is claimed is:

1. An amplifier comprising:
   a first stage configured to receive a bias voltage and a control signal independent of the bias voltage, configured to detect and output a difference between a reference voltage and a feedback voltage according to the control signal and a bias current,
   wherein the control signal is increased from a first level until an external voltage becomes equal to or more than a set level and the control signal transits to a second level when the external voltage becomes equal to or more than the set level, and
   wherein an amount of the bias current is maintained according to the bias voltage until the control signal has the second level, and the amount of the bias current is forcibly increased when the control signal has the second level.

2. The amplifier according to claim 1, wherein the control signal increases during a power-up process of a semiconductor apparatus.

3. The amplifier according to claim 1, wherein the first stage comprises:
   a first transistor array to which an external voltage is applied in common and having a gate terminal to which a bias voltage is applied in common;
   a second transistor array electrically connected to the first transistor array and having a gate terminal to which the control signal is inputted in common;
   a third transistor electrically connected to the first transistor array and the second transistor array and configured to receive the reference voltage;
   a fourth transistor electrically connected between the third transistor and a ground voltage terminal;
   a fifth transistor electrically connected to the first transistor array and the second transistor array and configured to receive the feedback voltage; and
   a sixth transistor electrically connected between the fifth transistor and a ground voltage terminal.

4. The amplifier according to claim 3, wherein the first transistor array includes a plurality of transistors of which all but one are respectively and electrically connected to a plurality of transistors of the second transistor array.

5. The amplifier according to claim 3, wherein the third transistor is electrically connected in common to one of a plurality of transistors of the first transistor array and the plurality of transistors of the second transistor array.

6. The amplifier according to claim 3, wherein a plurality of transistors of the first transistor array and a plurality of transistors of the second transistor array are configured to have narrower gate widths than the third, fourth, fifth, and sixth transistors.

7. The amplifier according to claim 3, wherein the first stage is configured so that a sum of current driving forces of the first transistor array and the second transistor array is substantially equal to a current driving force of each of the third, fourth, fifth, and sixth transistors.

8. The amplifier according to claim 1, wherein the amount of the bias current is forcibly adjusted by the control signal within a maximum value determined according to the bias voltage.

9. A voltage generation circuit comprising:
   an amplifier configured to be input a bias voltage and a control signal independent of the bias voltage, configured to detect a difference between a reference voltage and a feedback voltage according to the control signal and a bias current, and configured to generate a driving signal; and a driver configured to generate an internal voltage by driving an external voltage according to the driving signal, wherein the control signal is increased from a first level until the external voltage becomes equal to or more than a set level and the control signal transits to a second level when the external voltage becomes equal to or more than the set level, and wherein an amount of the bias current is maintained according to the bias voltage until the control signal has the second level, and the amount of the bias current is forcibly increased when the control signal has the second level.

10. The voltage generation circuit according to claim 9, wherein the control signal increases during a power-up process of a semiconductor apparatus.

11. The voltage generation circuit according to claim 9, further comprising:
   a distribution resistor configured to generate the feedback voltage by distributing the internal voltage; and
   a capacitor electrically connected, in parallel with the distribution resistor, between a terminal through which the internal voltage is outputted and a ground voltage terminal.

12. The voltage generation circuit according to claim 9, wherein the amplifier comprises:
   a comparator configured to detect and output the difference between the reference voltage and the feedback voltage according to the bias current; and
   a current mirror configured to generate the driving signal according to the output of the comparator.

13. The voltage generation circuit according to claim 12, wherein the comparator comprises:
   a first transistor array to which the external voltage is applied in common and having a gate terminal to which a bias voltage is applied in common;
   a second transistor array electrically connected to the first transistor array and having a gate terminal to which the control signal is inputted in common;
   a third transistor electrically connected to the first transistor array and the second transistor array and configured to receive the reference voltage;
   a fourth transistor electrically connected between the third transistor and a ground voltage terminal;
   a fifth transistor electrically connected to the first transistor array and the second transistor array and configured to receive the feedback voltage; and
   a sixth transistor electrically connected between the fifth transistor and the ground voltage terminal.

14. The voltage generation circuit according to claim 13, wherein the first transistor array includes a plurality of transistors of which all but one are respectively and electrically connected to a plurality of transistors of the second transistor array.

15. The voltage generation circuit according to claim 13, wherein the third transistor is electrically connected in common to one of a plurality of transistors of the first transistor array and a plurality of transistors of the second transistor array.

16. The voltage generation circuit according to claim 13, wherein a plurality of transistors of the first transistor array and a plurality of transistors of the second transistor array are configured to have narrower gate widths than the third, fourth, fifth, and sixth transistors.

17. The voltage generation circuit according to claim 13, wherein the comparator is configured so that a sum of current driving forces of the first transistor array and the second transistor array is substantially equal to a current driving force of each of the third, fourth, fifth, and sixth transistors.

18. The voltage generation circuit according to claim 12, wherein the current mirror comprises:
   a first transistor configured to receive the external voltage;
   a second transistor electrically connected between the first transistor and a ground voltage terminal;
   a third transistor configured to receive the external voltage and having a gate terminal electrically connected to the first transistor; and
   a fourth transistor electrically connected between the third transistor and the ground voltage terminal,
   wherein the driving signal is generated at a node to which the third transistor and the fourth transistor are electrically connected.

19. The voltage generation circuit according to claim 9, wherein the amount of the bias current is forcibly adjusted by the control signal within a maximum value determined according to the bias voltage.

20. A voltage generation circuit comprising:
   a first transistor array to which an external voltage is applied in common and having a gate terminal to which a bias voltage is applied in common;
   a second transistor array electrically connected to the first transistor array and having a gate terminal to which a control signal is inputted in common;
   a third transistor electrically connected to the first transistor array and the second transistor array and configured to receive a reference voltage;
   a fourth transistor electrically connected between the third transistor and a ground voltage terminal;
   a fifth transistor electrically connected to the first transistor array and the second transistor array and configured to receive a feedback voltage;
   a sixth transistor electrically connected between the fifth transistor and a ground voltage terminal and configured to generate a driving signal;
   a driver configured to generate an internal voltage by driving the external voltage according to the driving signal; and
   a distribution resistor configured to generate the feedback voltage by distributing the internal voltage,
   wherein an amount of a bias current flowing through the first transistor array and the second transistor array according to a bias voltage is forcibly adjusted according to the control signal.

21. The voltage generation circuit according to claim 20, wherein the control signal is substantially maintained to a first level according to a level of the external voltage during a power-up process of a semiconductor apparatus, and transitions to a second level as the level of the external voltage becomes equal to or more than a set level.

22. The voltage generation circuit according to claim 20, wherein the first transistor array includes a plurality of transistors of which all but one are respectively and electrically connected to a plurality of transistors of the second transistor array.

23. The voltage generation circuit according to claim 20, wherein the third transistor is electrically connected in common to one of a plurality of transistors of the first transistor array and a plurality of transistors of the second transistor array.

24. The voltage generation circuit according to claim 20, wherein a plurality of transistors of the first transistor array and a plurality of transistors of the second transistor array are configured to have narrower gate widths than the third, fourth, fifth, and sixth transistors.

25. The voltage generation circuit according to claim 20, wherein the voltage generation circuit is configured so that a sum of current driving forces of the first transistor array and the second transistor array is substantially equal to a current driving force of each of the third, fourth, fifth, and sixth transistors.

26. The voltage generation circuit according to claim 20, wherein the amount of the bias current is forcibly adjusted by the control signal within a maximum value determined according to the bias voltage.

\* \* \* \* \*